US007724526B2

(12) United States Patent  
Hinze et al.

(10) Patent No.: US 7,724,526 B2
(45) Date of Patent: May 25, 2010

(54) ELECTRONIC MODULE WITH HEAT SINK

(75) Inventors: Lee R. Hinze, Allen, TX (US); G. Venkata Krishnan, Bangalore (IN); Scott E. Wilson, Knoxville, TN (US)

(73) Assignee: Delphi Technologies, Inc., Troy, MI (US)

( * ) Notice: Subject to any disclaimer, the term of this patent is extended or adjusted under 35 U.S.C. 154(b) by 33 days.

(21) Appl. No.: 12/287,560

(22) Filed: Oct. 10, 2008

(65) Prior Publication Data

US 2010/0091460 A1 Apr. 15, 2010

(51) Int. Cl.
*H05K 7/20* (2006.01)
(52) U.S. Cl. .................. 361/704; 361/679.54; 361/709; 361/713; 361/714; 257/706; 257/710; 165/80.2; 165/80.3; 165/104.33
(58) Field of Classification Search ............ 361/679.46, 361/679.47, 679.54, 704, 707–715, 717–719; 257/666, 668, 690, 673, 616, 607, 706–727, 257/E21.503; 174/15.1, 16.3, 252, 50, 161, 174/163, 52.2–52.4; 165/80.2, 80.3, 104.33, 165/185; 29/602 R, 849, 852, 602.1, 841, 29/592.1, 832
See application file for complete search history.

(56) References Cited

U.S. PATENT DOCUMENTS

| | | | |
|---|---|---|---|
| 5,552,961 A | 9/1996 | Van Gaal et al. | |
| 5,608,610 A | 3/1997 | Brzezinski | |
| 5,946,192 A * | 8/1999 | Ishigami et al. | 361/704 |
| 6,008,536 A | 12/1999 | Mertol | |
| 6,058,013 A * | 5/2000 | Christopher et al. | 361/704 |
| 6,519,156 B2 * | 2/2003 | Scafidi | 361/704 |
| 6,882,535 B2 * | 4/2005 | Labanok et al. | 361/704 |
| 7,265,984 B2 * | 9/2007 | Numata | 361/719 |
| 7,532,474 B2 * | 5/2009 | Xue et al. | 361/704 |
| 2001/0013640 A1 | 8/2001 | Tao | |
| 2001/0026957 A1 | 10/2001 | Atwood et al. | |
| 2003/0051868 A1 | 3/2003 | Dishongh et al. | |
| 2003/0134454 A1 | 7/2003 | Houle | |

FOREIGN PATENT DOCUMENTS

| | | |
|---|---|---|
| JP | 2005-191130 | 7/2005 |
| JP | 2006-287065 | 10/2006 |
| JP | 2008-71854 | 3/2008 |

OTHER PUBLICATIONS

European Search Report dated Dec. 18, 2009.

* cited by examiner

*Primary Examiner*—Michael V Datskovskiy
(74) *Attorney, Agent, or Firm*—Jimmy L. Funke

(57) ABSTRACT

An electronic module includes a printed circuit board with a heat producing electrical component assembled in an insulating housing. The component is adjacent a thermally conducting heat sink with a thermally conductive material disposed therebetween. Integral with the heat sink is a thermally conductive runner, partially encased in the housing wall, connecting the heat sink to a thermally conductive port. The port is coupled to a base structure when the housing is attached to the base, forming a heat conduction path from the component to the base. This conductive path may also provide an electrical ground path from the printed circuit board to the base.

14 Claims, 1 Drawing Sheet

ELECTRONIC MODULE WITH HEAT SINK

TECHNICAL FIELD OF INVENTION

The invention relates to an electronic module, configured to be mounted on a base, and housing a heat producing electrical component. More particularly, the invention comprises an insulating housing with an embedded heat sink for convective dissipation of heat and a conductive runner extending from the heat sink to the port for conductive dissipation of heat. The port is coupled to the base structure, providing both a conductive heat sink and an electrical ground.

BACKGROUND OF INVENTION

It is known to package a printed circuit board (PCB) with heat producing electrical components in an electronic enclosure. The enclosure includes a thermal heat sink to prevent overheating of the electrical components. Metal enclosures with heat sinks, although efficient at removing heat, are less amenable to the intricate geometries that are desirable for electronic enclosures. Plastic enclosures are poor conductors of heat and are not as efficient at removing excess heat from heat producing electrical components. It is desired to have an electronic enclosure, made of a thermally insulating material such as plastic, which provides mechanisms for heat sinking and electrically grounding electrical components on a PCB.

SUMMARY OF THE INVENTION

In accordance with this invention, an electronic module comprises a housing formed at least partially of an insulating material which includes a wall and a means for mounting the housing to a conductive base. The module further includes a heat sink adjacent a heat producing electrical component within the housing. The heat sink conducts thermal energy from the component and expels it by thermal convection external the housing. The module also includes a thermally conductive port on the exterior surface of the housing, which is coupled to the conductive base. A thermally conductive runner insert molded in the wall of the housing connects the heat sink with the port. This runner provides a thermal conduction path between the housing and the base to further expel heat from the heat producing electronic device.

In one aspect of the invention, an electronic module comprises a housing formed at least partially of an insulating material. The housing includes a means for mounting the housing to a conductive base including a thermally conducting port on the external surface of the housing. The port is configured to accept the integrally formed mounting means of the base, enabling thermal energy transfer from the port to the base. The housing further includes a heat sink having a contact surface and a thermally conductive material disposed between the heat producing electrical component and the contact surface to enhance heat transfer. The heat sink also comprises fins, located opposite the contact surface and external the housing, to dissipate heat by thermal convection. Finally, the electronic module comprises a thermally conductive runner interconnecting the heat sink and the port to conduct heat from the heat sink in the housing to the conductive base. The runner is at least partially embedded in the wall of the housing.

In another aspect of this invention, an electronic module comprises a housing formed at least partially of an injection molded thermoplastic material which includes a wall and a means for mounting the housing to a conductive base. A printed circuit board with at least one electrical ground lead is disposed inside the housing. An electrical connector disposed within the housing is in contact with the electrical ground lead on the PCB. The housing also comprises an electrically conductive port on the external surface of the housing. This port is configured to accept the integrally formed mounting means of the base, enabling electrical grounding from the port to the base. The electronic module further includes an electrically conductive runner at least partially insert molded within the wall of the housing. The runner interconnects the electrical connector and the port and provides an electrical ground path from the printed circuit board to the base.

Further features and advantages of the invention will appear more clearly on a reading of the following detailed description of the preferred embodiment of the invention, which is given by way of non-limiting example only and with reference to the accompanying drawings.

BRIEF DESCRIPTION OF DRAWINGS

This invention will be further described with reference to the accompanying drawings in which.

DETAILED DESCRIPTION OF INVENTION

Figure 1:
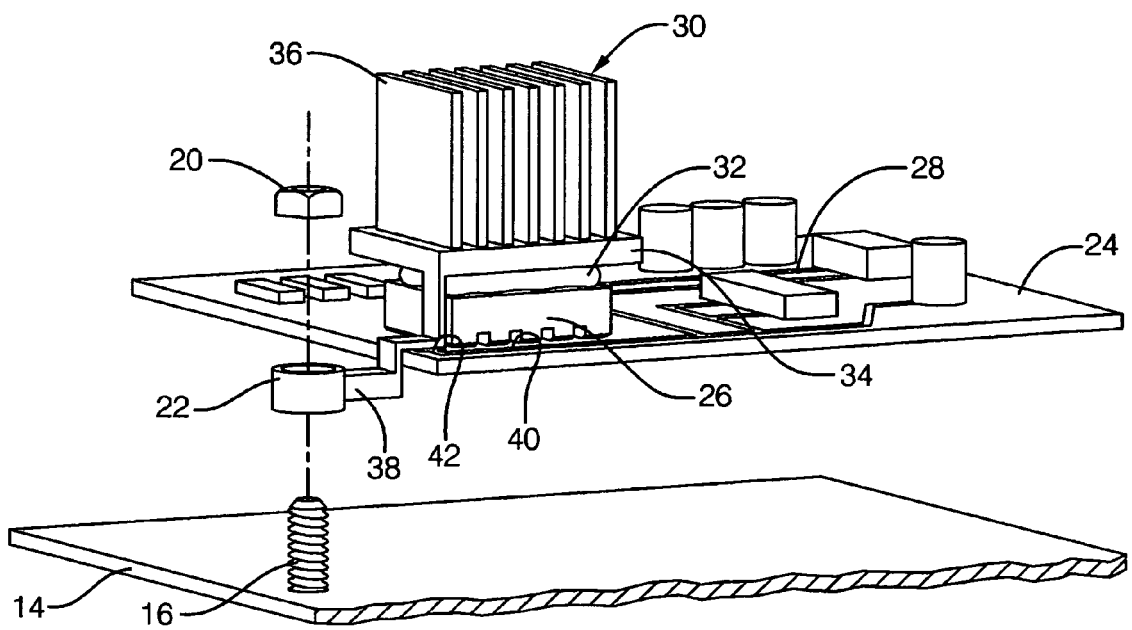
FIG. 1 is a broken, perspective, exploded view of the electronic module with the plastic case removed.
Figure 2:
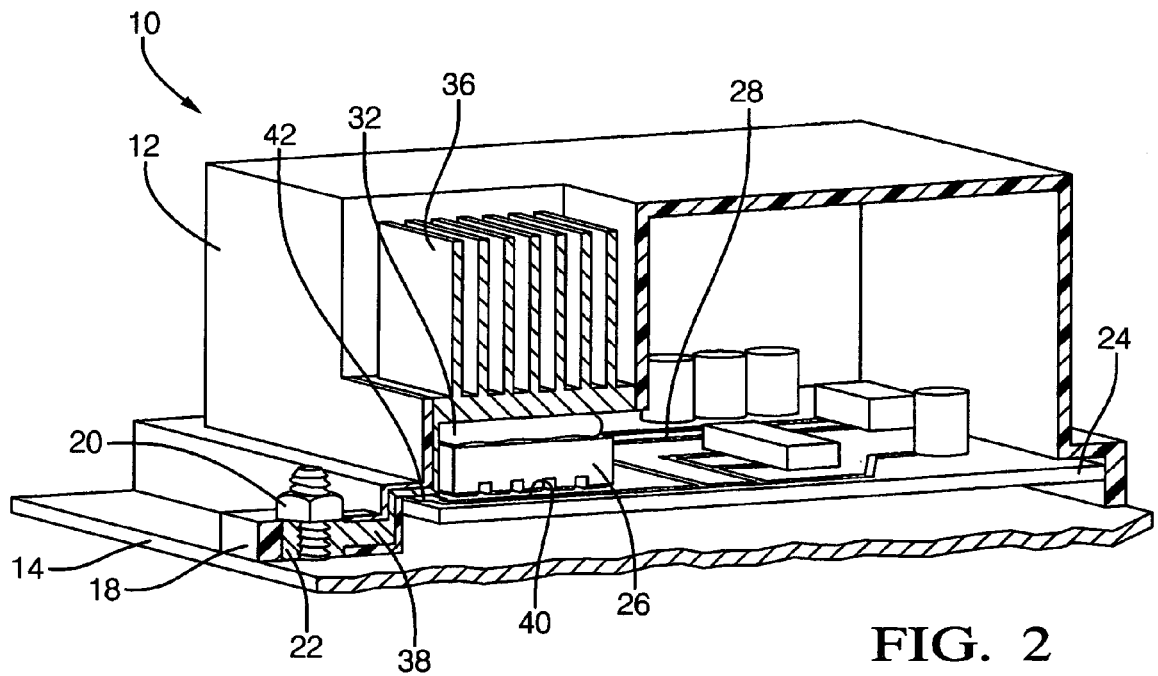
FIG. 2 is a perspective view of the electronic module attached to the base.

In accordance with a preferred embodiment of this invention, referring to FIGS. 1 and 2, an electronic module 10 is comprised of a housing 12, made at least partially of an insulating material such as plastic, mounted to a conductive base 14. The base is preferably made of metal and comprises a lug 16 to accept mounting means 18 defined by the housing. The base 14 provides mechanical support for the housing 12 when it is secured using a lug nut 20. The lug 16 is integrally formed on the base which, in combination with lug nut 20, provides suitable means for connecting the base 14 to the electronic module 10. However, any means of connecting the housing to the base would be acceptable. The mounting means 18 of the housing 12 comprises a thermally conductive port 22. The port 22 is made of metal and provides enhanced structural integrity to the mounting means of the housing 12.

The electronic module 10 also comprises a printed circuit board 24, with at least one heat producing electrical component 26, enclosed within the housing 12. The printed circuit board 24 physically supports the electrical component 26 and provides an electric circuit 28 to operate all the components on the circuit board. Any other suitable substrate, including ceramic substrates, could be substituted for the printed circuit board in this invention. The heat producing electrical component 26 is adjacent a heat sink 30, with thermally conductive material 32 disposed between the component 26 and the heat sink 30. Heat generated by the component 26 is transferred by thermal conduction through the thermally conductive material 32 into the foundation 34 of the heat sink. Heat is then transferred by thermal conduction from the foundation 34 to heat sink fins 36, where it is dissipated by thermal convection due to fluid flow across the fins 36. The heat sink 30 is preferably made of a metal with high thermal conductivity and is insert molded into the housing 12 so as to align the foundation 34 with the heat producing electrical component 26. Thermally conductive material 32 is used to enhance thermal conduction between the component 26 and the heat sink foundation 34. The fins 36 are disposed on the exterior of the housing to enable fluid flow for convective cooling.

A conductive runner 38 is integrally formed connecting the heat sink foundation 34 and the port 22. The runner 38 is formed of a metal with high thermal conductivity, preferably the same metal as the heat sink 30 and the port 22. The runner is at least partially embedded in the plastic housing 12. The conductive runner 38 enables a thermal conduction path from the heat producing electrical component 26, through the thermally conductive material 32, the heat sink foundation 34, the thermally conductive runner 38, the port 22, and the lug 16 to the base 18. This feature allows for a second heat sinking path from the component 26 to the base 18.

Thus, this invention provides an electronic module, including a housing containing a printed circuit board with a heat producing electronic component. The housing has a mounting means for connecting to a conductive base. The mounting means provides structural support for the housing as well as a conductive port integrated into the mounting means. The conductive port is integrally formed with a conductive runner connecting the port and the foundation of a heat sink. The heat sink foundation is disposed adjacent the heat producing electronic component with a thermal conductive material therebetween. Heat from the heat producing electronic component is dissipated by conduction through the thermal conductive material to the heat sink foundation. From the heat sink foundation the heat may travel in one of two possible paths. The first path is from the heat sink foundation to the heat sink fins, which are disposed external the housing and are configured to dissipate the heat by convection to the external fluid flow. The second path is from the heat sink foundation through the conductive runner, the port, the lug and finally to the conductive base. The conductive runner enables a second conduction path for heat transfer out of the heat producing electronic component, increasing the efficiency of cooling the component, and increasing the reliability of the electronic module.

The manufacture of electronic module 10 will now be described. Housing 12 is formed by injection molding an insulating plastic material using a mold having the specific size and shape for receiving the heat producing electrical component 26. Prior to injection of the plastic material, the metal port 22 is placed in the locater section of the mold to ensure proper alignment of the conductive runner 38 and the heat sink 30. The locater section of the mold is the area that will form the mounting means 18 in the electronic module. The port 22, runner 38, and heat sink 30 are all one integral piece of conductive metal material. After proper location of the aforementioned metal piece, the insulating plastic material is injected into the mold, encasing a portion of both the thermally conductive runner 38 and heat sink foundation 34, and creating a cavity in which the printed circuit board 24 can be installed. A thermally conductive material 32 is applied to the bottom surface of the heat sink foundation 34 and the printed circuit board 24 is installed in the housing 12 so that the thermally conductive material 32 is disposed between the component 26 and the heat sink foundation 34.

In an alternate embodiment an electronic module 10 is comprised of a housing 12, made at least partially of an insulating material such as plastic, mounted to a conductive base 14. The base 14 is preferably made of metal and comprises a lug 16 to accept the mounting means 18 of the housing. The base 14 provides mechanical support for the housing 12 when it is secured with lug nut 20. A lug integrally formed on the base, in combination with a lug nut, provides suitable means for connecting the base to the electronic module, however any means of connecting the housing to the base would be acceptable. The mounting means 18 of the housing 12 comprises an electrically conductive port 22. The port 22 is made of metal and provides enhanced structural integrity to the mounting means of the housing.

The electronic module 10 also comprises a printed circuit board 24, with at least one electrical ground lead 40, enclosed within the housing 12. The printed circuit board 24 provides the electric circuit 28 to operate all the components on the circuit board 24. Any other suitable substrate, including ceramic substrates, could be substituted for the printed circuit board in this invention. The electrical ground lead 40 is adjacent electrical connector 42, to facilitate electrical grounding of the printed circuit board 24.

A conductive runner 38 is integrally formed connecting the electrical ground lead 40 and the port 24. The conductive runner 38 is formed of a metal, preferably the same metal as the electrical ground lead 40 and the port 24. The runner 38 is at least partially embedded in the plastic housing 12. The conductive runner 38 enables an electrical grounding path from the electrical connector 42, through the conductive runner 38, the port 22, and the lug 16 to the base 18. This feature allows for an electrical grounding path from the printed circuit board 24 to the base 18.

Thus, this embodiment provides an alternative use for the conductive runner connecting the heat sink and the base. It may be desirable to use a conductive path from the printed circuit board and the components on the printed circuit board for both a heat sink and an electrical ground path. The printed circuit board and the heat producing components on the printed circuit board may be located within the housing. The conductive runner would allow for conductive heat dissipation from the component to the base external the housing. The conductive runner would also allow for an electrical ground path from the circuit on the printed circuit board to the base external the housing.

While this invention has been described in terms of the preferred embodiments thereof, it is not intended to be so limited, but rather only to the extent set forth in the claims that follow.

We claim:

1. An electronic module comprising:
   a housing formed at least partially of an insulating material including a wall and means for mounting said housing to a base, said base formed of a conductive material;
   a heat sink disposed adjacent a heat producing electrical component within said housing, said heat sink operative to expel thermal energy externally of said housing by thermal convection;
   a port formed of a thermally conductive material on an external surface of said housing, said port coupled to said base structure; and
   a runner formed of thermally conductive material interconnecting said heat sink and said port for expelling thermal energy from said housing into said base by thermal conduction, wherein at least a portion of said runner is insert molded within said wall.

2. The electronic module of claim 1, wherein said mounting means comprises a feature integrally formed with said base and adapted to accept said port.

3. The electronic module of claim 1, wherein said housing wall portion is formed of injection molded thermoplastic material.

4. The electronic module of claim 3, wherein at least a portion of said thermal runner in insert molded within said wall.

5. The electronic module of claim 2, wherein said mounting feature comprises a lug integrally formed with said housing and contacting said port.

6. The electronic module of claim 1, wherein the heat sink comprises a contact surface and a thermally conductive material disposed between the heat producing electrical component and said contact surface.

7. The electronic module of claim 1, wherein said heat sink comprises fins, said fins located opposite said contact surface and external said housing, wherein said fins contact fluid flow to dissipate heat by thermal convection.

8. An electronic module comprising:
   a housing formed at least partially of an insulating material including a wall and means for mounting said housing to a base, said base formed of an electrically conductive material;
   a printed circuit board enclosed in said housing, said printed circuit board including at least one electrical component and an electrical ground lead;
   a port formed of a electrically conductive material on an external surface of said housing, said port coupled to said base structure;
   an electrical connector within said housing connected to said electrical ground lead; and
   a runner formed of electrically conductive material interconnecting said electrical connector and said port, said runner operative to provide electrical ground from said printed circuit board to said base, wherein at least a portion of said runner is insert molded within said wall.

9. The electronic module of claim 8, wherein mounting means comprises a feature integrally formed with said base and adapted to accept said port.

10. The electronic module of claim 8, wherein said housing wall portion is formed of injection molded thermoplastic material.

11. The electronic module of claim 10, wherein at least a portion of said thermal runner in insert molded within said wall.

12. The electronic module of claim 9, wherein said mounting feature comprises a lug integrally formed with said housing and contacting said port.

13. The electronic module of claim 8, comprising a heat producing electronic component and a heat sink adjacent the component, said heat sink and said runner made of a thermally conductive material.

14. A method of forming an electronic module comprising:
   providing a mold for injection molding said electronic module, said mold having a locater section;
   locating a thermally and electrically conductive port into said locater section, said port connected to an thermally and electrically conductive runner and a heat sink;
   injecting a thermally insulating material into said mold, wherein at least a portion of said thermally and electrically conducting runner is encased in said thermally and electrically insulating material; and
   installing a printed circuit board containing at least one heat producing electrical component and at least one ground, said component adjacent to said heat sink.

* * * * *